Nov. 10, 1970 H. OTTESEN 3,540,037
TIME SHARED BIPOLAR ANALOG-TO-DIGITAL AND
DIGITAL-TO-ANALOG CONVERSION APPARATUS
Filed July 20, 1967
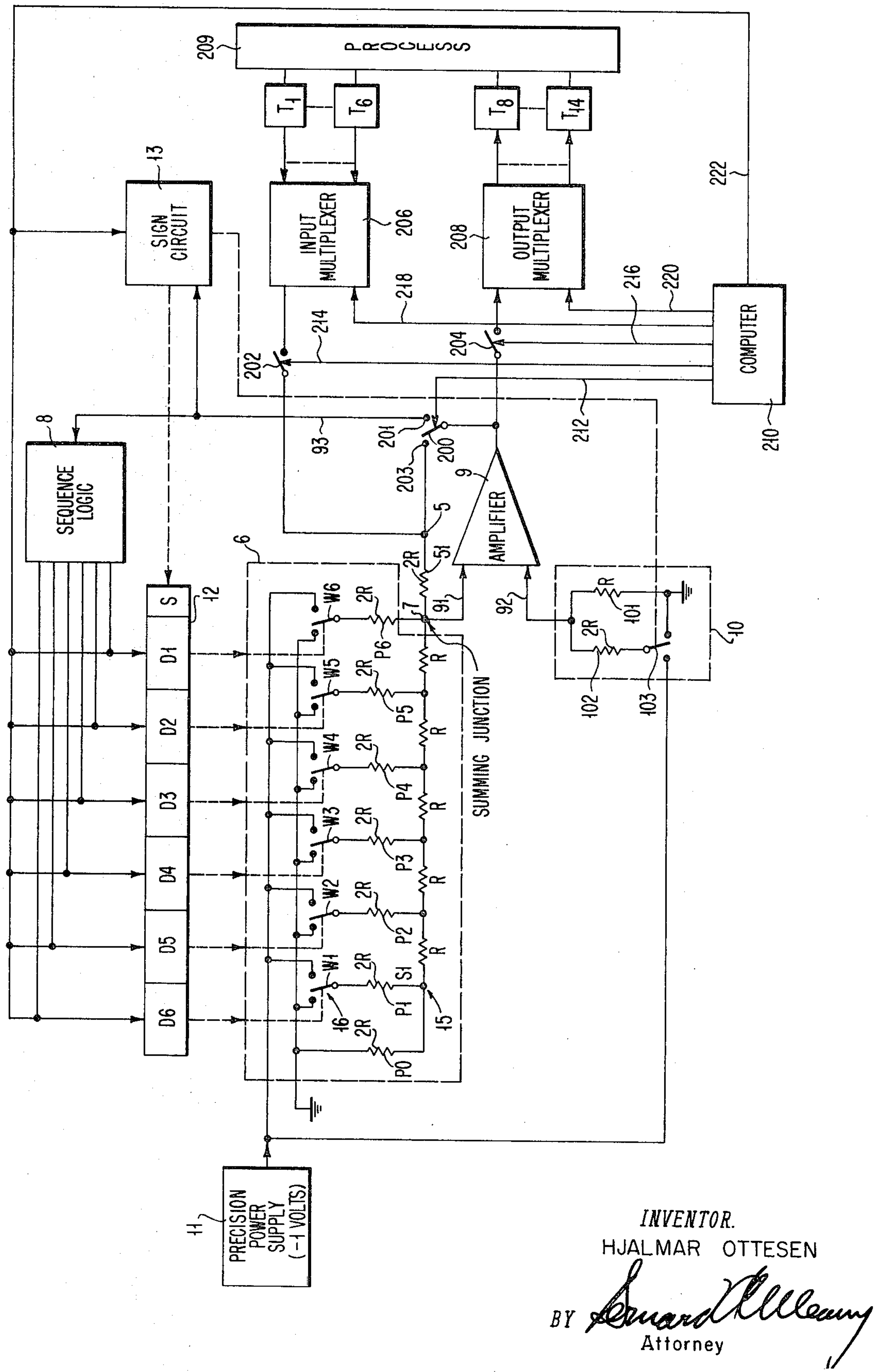
*INVENTOR.*
HJALMAR OTTESEN
BY [signature]
Attorney United States Patent Office 3,540,037
Patented Nov. 10, 1970

3,540,037

TIME SHARED BIPOLAR ANALOG-TO-DIGITAL AND DIGITAL-TO-ANALOG CONVERSION APPARATUS

Hjalmar Ottesen, Oslo, Norway, assignor to International Business Machines Corporation, Armonk, N.Y., a corporation of New York Filed July 20, 1967, Ser. No. 654,762
Int. Cl. H03k *13/02*
U.S. Cl. 340—347 8 Claims

ABSTRACT OF THE DISCLOSURE

Conversion apparatus of the successive approximation type selectively operable as a bipolar analog-to-digital converter (ADC) or as a bipolar digital-to-analog converter (DAC); the mode of operation is determined by switching the output of an amplifier and thereby changing the functional nature of that amplifier. The amplifier serves as a comparator in the ADC mode and alternatively as an operational amplifier in the DAC mode.

CROSS-REFERENCES TO RELATED APPLICATIONS

A bipolar analog-to-digital converter of the successive approximation type is described in copending U.S. patent application Ser. No. 460,431, filed June 1, 1965, assigned to IBM, and invented by me. The contents of that application are specifically incorporated herein and made a part of the disclosure of this application.

BACKGROUND OF THE INVENTION

Field of the invention

Electronic computers are used in greater numbers today than ever before in all industries, but particularly in the area of process control. The future will find greater numbers of them in use in the particular environment.

It is necessary for the computer to communicate with the process being controlled. The computer operates upon digital quantities (e.g., binary coded information). The process measuring instruments (e.g., transducers), by contrast, produce analog quantities (e.g., voltage or current levels). Transducers serving as process regulating instruments also require analog quantities.

An art devoted to the development of equipment capable of converting analog quantities to digital values and vice-versa has thus grown over the past years. It has been difficult to modify an analog-to-diigtal converter to serve as a digital-to-analog converter; that is, it has been necessary to provide two separate converters. Yet, both functions are generally necessary to control a physical process effectively with digital computing equipment.

Description of the prior art

Analog-to-digital converters have been of several primary types—like successive approximation and integrating ramp converters.

In the successive approximation type of ADC, an analog signal is compared to analog representations of a sequence of digital numbers. When an equality is indicated, the digital number present at the time of equality is used as the output of the analog-to-digital converter.

A second type of analog-to-digital converter is an integrating ramp type of converter. There, an unknown analog signal is integrated for a fixed period of time, thereby establishing a first voltage level. Then, a reference voltage is integrated until that voltage level is brought through a ground potential. The time necessary to so integrate the reference voltage is measured, and that time is translated to a digital value equivalent to the unknown analog input signal. Such an integrating ramp type of converter is described in a copending application, Ser. No. 649,161 by H. B. Aasnaes, "Triple Integrating Ramp Analog to Digital Converter," assigned to the same assignee as the instant application.

Digital-to-analog converters have been of several primary types as well. One kind of particular interest utilizes a ladder network to generate an analog voltage corresponding to the digital number. The resistors in the ladder are switched in response to signals representing the digital number, and the analog voltage is immediately available.

Prior art converters of either type (i.e., ADC or DAC) have suffered from several disadvantages: their speed of operation has lagged behind the data processing speeds of associated equipment; their resolution is frequently a function of the number and quality of components used; they experience difficulty in accommodating themselves to bipolar input signals (that is, signals first of one polarity and then signals of the opposite polarity); etc. Most importantly, though, an apparatus capable of operating selectively as a bipolar ADC or a DAC and overcoming these disadvantages has not been known to the prior art. When both functions have been required, it has been necessary to supply two separate converters.

Accordingly, it is a general object of this invention to provide an improved conversion apparatus.

It is a more particular object of this invention to provide an improved conversion apparatus of the successive approximation type.

It is a still further object of this invention to provide an improved conversion apparatus which can selectively function as either an ADC or a DAC.

Still another object of this invention is to provide apparatus of the type just described which, when operating as an analog-to-digital converter, provides the advantages of bipolar operation set forth in my copending application Ser. No. 460,431; and when operating as a digital-to-analog converter can accommodate bipolar digital numbers in either their "true" form or in their "two's complement" form while using only one reference supply.

SUMMARY OF INVENTION

In accordance with one aspect of my invention, apparatus selectively operable as a bipolar ADC or as a bipolar DAC is provided. The successive approximation ADC mode of operation described in my previously referenced copending application Ser. No. 460,431 is available from the ladder network, digital register, sequence logic, sign circuit, reference circuitry and amplifying element described therein. The structure set forth in that application appeared restricted to operation as an ADC. However, it has been discovered that by switching the output of that amplifying element into circuit with the ADC mode input terminal, a bipolar digital-to-analog converter is obtained.

When the output is switched as noted the function and operation of the combinational circuitry is changed;

particularly, that of the amplifying element. As an ADC, the amplifying element operates as a comparator; an associated resistor then serves as an input resistor for the ladder network. In the DAC mode of operation that resistor, or equivalent resistive means, is switched into feedback circuit with the amplifying element; this comes about by switching the output of the amplifying element out of circuit with both the sequence logic and sign circuit and into circuit with the noted input resistor, or its equivalent. The amplifying element now functions as an operational amplifier, and an analog signal proportional to a digital input can be extracted from the apparatus.

As an extension of my invention, additional equipment, such as a central processing unit (i.e., computer), can be provided to cooperate with this apparatus. When a signal of an analog nature is coming into the conversion aparatus, the amplifier output is connected to the sequence logic and the sign circuit; the amplifier serves as a comparator; and the apparatus serves as an analog-to-digital converter. While the digital number so generated by the converter is being supplied to the central processing unit, a digital-to-analog conversion can be made of another digital number generated by the central processing unit. This DAC operation is accomplished by switching the output of the amplifier into circuit with the input resistor, thereby placing that resistor in feedback circuit with the amplifying element. The amplifier now functions as an operational amplifier. A digital-to-analog conversion can be made. Thus, in accordance with another aspect of my invention, the apparatus can be time shared with additional equipment. At one time, it serves as an ADC; at another time, as a DAC.

My invention offers a number of significant advantages. Perhaps the most striking advantage is that it enables one to have both an analog-to-digital conversion capability and a digital-to-analog conversion capability using common circuitry. Only a very minor modification to the conversion apparatus, along with relatively simple switching circuitry, need to be provided to obtain the two functions. Successive approximation in the analog-to-digital conversion mode yields a high conversion speed and accuracy at a cost comparing favorably with any known conversion technique. In the digtal-to-analog conversion mode, all the ladder leg switches are set simultaneously and the bipolar analog equivlent voltage corresponding to the known digital number appears at the output of the operational amplifier almost instantaneously.

A second striking advantage of this apparatus is that it can accommodate bipolar inputs and outputs while using only a single unipolar reference quantity. This keeps the relative error between the analog-to-digital converter and the digital-to-analog converter to a minimum. Any time a parameter in an apparatus can be made constant, errors due to that parameter are minimized. From a practical viewpoint, it simplifies certain calibration procedures generally necessary in a field environment.

Advantages also flow from the dual-nature of the conversion apparatus. It can be changed from a DAC to an ADC by simply switching the output of an amplifying element. The number of components (and hence the cost) is reduced by almost one-half when contrasted to the necessity of supplying a separate analog-to-digtal converter and a separate digital-to-analog converter, each using a unipolar reference voltage. Further, if a more conventional bipolar ADC and DAC of the type commonly available were used, then it would be necessary to provide a positive and a negative reference supply for each converter, thereby making a total of four reference supplies in all. By contrast, my invention requires a single reference supply, and that supply can be used in both the analog-to-digital conversion mode and the digital-to-analog conversion mode.

In addition, a number of related advantages are present. The reduced number of components increases the reliability of the system; the fewer the components, the less the probability of component failure. Short and long term drifts within the circuitry are minimized. The compact nature of the cricuitry makes it readily adaptable to monolithic circuitry with all its attendant advantages. Lastly, my invention can be embodied in either voltage mode or current mode components, thereby utilizing the characteristics of one mode or the other most suitable for a particular application.

Summarizing the advantages, one can obtain a conversion apparatus selectively operable as a bipolar ADC or DAC at roughly one-half the expected cost by switching the output of an amplifying element already present in a bipolar ADC.

Accordingly, the foregoing and other objects, features and adavntages of the invention will be apparent from the following more particular description of the preferred embodiment of the invention, as illustrated in the accompanying drawing.

BRIEF DESCRIPTION OF THE DRAWING

The drawing illustrates a combined block diagram-schematic of a preferred embodiment of my invention.

DETAILED DESCRIPTION OF THE PREFERRED EMBODIMENT

With particular reference to the drawing, a preferred embodiment of my invention is shown for functioning selectively as a bipolar analog-to-digital converter or a bipolar digital-to-analog converter, both with a single reference supply. Apparatus for converting an analog input signal to a digital number comprising seven binary bits of information, including a sign bit, is shown, as is apparatus for converting a digital number comprising seven bits of binary information to an analog value. The selection of seven bits has been made for exemplary purposes only. Since my invention includes apparatus previously shown and described in copending application Ser. No. 460,431 (and since the description in that application is expressly incorporated in this application), the equipment shown in that application has been repeated herein and similarly numbered for ease of explanation. Additional equipment for providing the selective function, or time-sharing function, has been added to that equipment.

Reviewing briefly the equipment shown and described in copending application Ser. No. 460,431, a digital-to-analog convetrer 6, responsive to a seven-bit position register 12, is connected to a summing junction 7 which, in turn, leads to an amplifying element 9 (labeled comparator in application Ser. No. 460,431). A precision power supply 11 and an input circuit 10 are also provided, input circuit 10 being connected as a second input to the amplifying element 9. Sequence logic 8 sets the bit positions in register 12 when that apparatus is functioning as an analog-to-digital converter and sign circuit 13, responsive to the output of amplifying element 9 on line 93, sets the sign bit position S in register 12.

With continued reference to FIG. 1, and with more particular reference to the instant invention, the provision of switches 200, 202, 204 will enable this equipment to cooperate with associated equipment and function selectively as a bipolar analog-to-digital converter or a bipolar digital-to-analog converter. That associated equipment could comprise, for example, an input multiplexer 206 and an output multiplexer 208. Both multiplexers 206, 208 could be stepping switches. Similarly, a plurality of transducers $T_1$ through $T_6$ can be connected to input multiplexer 206, and these transducers $T_1$ through $T_6$ will supply analog voltage levels to input multiplexer 206. Those transducers can be called analog input signal generators.

Output multiplexer 208 will also have a plurality of transducers $T_8$ through $T_{14}$ associated with it. Output multiplexer 208 will provide analog voltage levels to those transducers $T_8$ through $T_{14}$ so as to set them in a particular desired operating condition. Transducers $T_1$–$T_6$ and $T_8$–$T_{14}$ can, for example, be connected to a process 209, such as petroleum distillation. In an actual process control environment, computer 210 (such as an IBM 1800 Process Control Computer) supervises the operation of the equipment shown. For example, computer 210 can provide command signals to set switches 200, 202, 204 on lines 212, 214, 216, respectively. Likewise, command signals on lines 218, 220 (sequentially or selectively) operate input multiplexer 206 and output multiplexer 208, respectively. In addition, as will be made clearer hereinafter, computer 210 will also provide, in parallel, on line 222 signals to establish a digital number in register 12 and operate sign circuit 13 (described more fully in my referenced copending application). If time would allow, signals on lines 212, 214, 216, 218, 220, 222 could be provided under the direction of a manual opertaor.

The apparatus should function as an analog-to-digital converter when it is desired to translate an analog signal from a transducer $T_1$ through $T_6$ to a digital value for storage, or other utilization, in computer 210. At that time, computer 210 will step input multiplexer 206 to the proper position by a signal on line 218 and will close switch 202 with a signal on line 214. At the same time, a signal on line 212 sets switch 200 to terminal 201, thereby connecting the output of amplifying element 9 to sign circuit 13 and sequence logic 8. Resistor 51, which can be looked upon as a dual-purpose resistor, will be switched into circuit with input multiplexer 206. The function of amplifying element 9 is now that of a comparator. In actual practice, it could be a standard differential amplifier. The apparatus shown then functions as an analog-to-digital converter. An analog input signal is made available from input multiplexer 206, through closed switch 202, to terminal 5. The operation of the apparatus shown, as an analog-to-digital converter, is exactly as set forth in my copending application Ser. No. 460,431. The contents of that application are not repeated here for simplicity's sake. However, they are incorporated, in their entirety including the drawings, so as to complete the disclosure of this application.

The apparatus shown can also operate as a digital-to-analog converter. When viewed in the light of this disclosure, the transition is simple. I have discovered that it is necessary only to switch the output of amplifying element 9. The function of amplifying element 9 then becomes that of an operational amplifier and a bipolar DAC is available.

In more detail, when computer 210 generates a digital number representing a setpoint value for a transducer $T_8$ through $T_{14}$, that digital number must be converted to an analog value and supplied through output multiplexer 208 to a proper one of transducers $T_8$ through $T_{14}$. In that situation, computer 210 supplies a signal on line 214 to open switch 202 and a signal on line 212 so as to set switch 200 to terminal 203, thereby switching the output of amplifying element 9 into circuit with resistor 51. Resistor 51 is now in feedback circuit with amplifying element 9. That element 9 now functions as an operational amplifier. Sign circuit 13 and sequence logic 8 are no longer in direct circuit with amplifying element 9; the connection via line 93 has been broken. At the same time, computer 210 supplies a signal on line 220 to output multiplexer 208, thereby conditioning it to pass the resultant analog value onto an associated transducer $T_8$ through $T_{14}$. Similarly, a signal is made available on line 216 to close switch 204 leading to output multiplexer 208. The digital number is generated in parallel on line 222 (e.g., a sequence of levels, the higher being the zero state and the lower being the one state) and it is supplied as shown to the digital register 12, setting each of the positions D1 through D6 to either a one or a zero, and to sign circuit 13. Sign circuit 13 sets a one or zero in the S position of register 12 and sets switch 103 to either ground or precision power supply 11, as disclosed in my referenced copending application.

Logic circuitry responsive to the register then sets switches W1 through W6 to their proper positions; each switch W1 through W6 can be connected either to precision power supply 11 or to ground. The logic circuitry is not shown in detail, since it is well known. For example, see U.S. Pat. 3,216,003, by Howard Funk et al., issued on Nov. 2, 1965, and assigned to the same assignee as the present invention. If a bit position in register 12 is a zero, the switch corresponding to that bit position will be set to, or connected to, ground. For example, if bit position D1 is a zero, switch W6 will be connected to ground. By contrast, if position D4 is a one, switch W3 will be connected to precision power supply 11. The operation of ladder networks is well known; their operation is described in detail in text books, but (more pertinently here) in my copending application Ser. No. 460,431 referred to earlier and already expressly incorporated herein. An analog signal (voltage) is generated at summing junction 7 in response to the weighted signal from ladder network 15 and that analog voltage is a representation of the digital number in register 12. The amplifying element 9, due to the insertion of resistor 51 in feedback circuit, now serves as an operational amplifier. The output of amplifying element 9 is now the analog voltage to be conveyed to a selected transducer. That output is then provided through switch 204, output multiplexer 208, and on to the proper transducer $T_8$ through $T_{14}$.

Several examples of converting a digital number to an analog voltage will be presented in order to more fully illustrate the operation of this invention in the digital-to-analog conversion mode. If computer 210 generates the following digital number in binary notation $$0111000 \qquad (1.0)$$

where bits D1 to D6 are written with the highest order bit D1 to the left as is conventional and the sign bit to the left of the highest order bit, then that number must be converted to an analog voltage. Note that the sign bit is 0 for a positive number and 1 for a negative number. When operating as a digital-to-analog converter, the switches W1 through W6 associated with the bit positions D6 through D1, respectively, are immediately set to their proper state; that is, they are connected by logic responsive to the individual bit positions of register 12 to either the precision power supply 11 or to ground. The sign register 102 is also either switched to ground (when the digital number being converted is positive) or to precision power supply 11 (when the digital number being converted is negative) through the manipulation of switch 103. The operation of switch 103 is controlled by sign circuit 13, as completely described in my copending application Ser. No. 460,431 incorporated herein. For the example given immediately above, switches W6, W5, W4 will all be connected to precision power supply 11, while switches W3, W2, W1 as well as switch 103 will all be connected to ground. If precision power supply 11 furnishes $-1$ volt, then the following mathematical relationship expresses the conversion of binary number 0111000 to an analog voltage:

$$\text{binary number } 0111000 = \tfrac{1}{2} + \tfrac{1}{4} + \tfrac{1}{8} = \tfrac{7}{8} \text{ of a volt} \qquad (2.0)$$

Taking another example which involves the conversion of a negative number expressed in two's complement form, consider the following binary number:

$$1011100 \qquad (3.0)$$

In this example, switch W6 will be connected to ground, switches W5, W4, W3 will be connected to precision power supply 11, and switches W2, W1 will be connected to ground. Switch 103, which connects the sign resistor 102, will be connected to precision power supply 11. Then, the mathematical expression for converting the binary number 1011100 to an analog voltage will be as follows:

$$\text{binary number } 1011100 = -1 + \tfrac{1}{4} + \tfrac{1}{8} + \tfrac{1}{16} = -\tfrac{9}{16} \text{ volt} \quad (4.0)$$

These examples have been given only to demonstrate the setting of switches and so forth for a particular conversion of a digital number to an analog value. The analog voltage generated can vary in accordance with the value of precision power supply 11; that is, power supply 11 can generate any negative voltage, thereby increasing the range of the analog voltage generated. Similarly, the number of bit positions in digital register 12 can be extended so long as the number of associated switches and legs in ladder network 15 are similarly extended.

It is emphasized once again that the novel point in this invention is the recognition of a dual function present in electrical apparatus of a particular sort; that is, by taking the apparatus set forth in my invention described in copending application Ser. No. 460,431, adding several switches and simple control circuitry, and switching the output of the amplifying element, that apparatus can function selectively as an analog-to-digital converter or a digital-to-analog converter.

Several modifications are within the scope of my invention. The associated equipment mentioned earlier is given by way of example; my invention can find utilization wherever an ADC or a DAC is required. The setting of the associated switches could, if time allowed, be done manually. If high speed operation was required, current sources and current switches (e.g., transistors) could be employed in the ladder network. By assigning weights to the current sources, the ladder network could effectively be eliminated. In the voltage mode, a positive reference supply could be substituted for the negative supply disclosed herein; positive numbers would then be in two's complement form. The number of digital-notation positions can also be expanded so long as the register and ladder network are likewise expanded.

While the invention has been particularly shown and described with reference to a preferred embodiment thereof, it will be understood by those skilled in the art that the changes previously suggested and other changes in form and details may be made therein without departing from the spirit and scope of the invention.

I claim:

1. Apparatus for functioning selectively as a bipolar analog-to-digital converter or as a bipolar digital-to-analog converter comprising in combination:

means for generating a digital notation representing a number and a polarity indication;

register means for storing said digital notation;

converter means for converting said digital notation stored in said register means to an analog signal weighted in proportion to the magnitude of said number;

a summing junction for receiving said analog signal;

means for generating a polarity dependent reference signal;

amplifying means responsive to signals at said summing junction and said reference signal for generating an output signal;

analog input means;

means sensitive to sign indications for controlling said reference signal means;

means for generating command signals; and switching means responsive to said command signals designating (a) digital-to-analog operation for coupling said output signal in feedback circuit with said amplifying means and for causing said sign sensitive means to respond to said polarity indication of said digital notation, or (b) analog-to-digital operation for uncoupling said output signal from the feedback circuit with said amplifying means, for coupling said analog input into said summing junction means, and for causing said sign sensitive means to be responsive to the output of said amplifying means.

2. Apparatus of the type set forth in claim 1 and including:

resistive means connected to said summing junction means and selectively connected by said switching means to said analog input means or to said output signal from said amplifying means.

3. Apparatus of the type set forth in claim 2 wherein said sign sensitive means responds to the output of said amplifying means during analog-to-digital operations for determining the polarity indication of the digital output.

4. Apparatus of the type set forth in claim 3 wherein said means for generating a reference signal comprises a unipolar reference source for generating a reference signal of one polarity.

5. Apparatus of the type set forth in claim 4 and including:

input multiplexing means for transferring analog input signals of unidentified magnitude from said analog input means to said resistive means;

transducers responsive to said output signal; and output multiplexing means for transferring said output signal from said amplifying means to said transducers.

6. Apparatus of the type set forth in claim 1 wherein said means for generating a reference signal comprises means for providing a ground potential to said amplifying means when converting numbers of a first polarity in the digital-to-analog conversion mode and for providing a reference signal to said amplifying means when converting numbers of a second polarity in the digital-to-analog conversion mode.

7. Apparatus for functioning selectively as a bipolar analog-to-digital converter or as a bipolar digital-to-analog converter comprising in combination:

register means for storing a binary number including a sign bit;

converter means for converting said binary number stored in said register means to a weighted signal;

a summing junction for receiving said weighted signals;

an amplifying means connected to said summing junction;

resistive means connected to said summing junction;

a source of analog input signals for generating analog input signals of unidentified magnitude;

first means for switching said resistive means into feedback circuit with said amplifying means;

second means for switching said resistive means out of feedback circuit with said amplifying means and into series circuit with said source of analog input signals of unidentified magnitude;

command signal generating means for generating command signals indicating that said apparatus is to function selectively as an analog-to-digital converter or as a digital-to-analog converter;

third means for selectively energizing said first and second means in response to individual ones of said command signals reference signal generating means for providing an input to said amplifying means; and sign circuit means responsive to actuation of said first switching means for detecting the state of said sign bit and for causing said reference signal generating means to produce a reference signal for said amplifying means in accordance with said sign bit;

said sign circuit means being responsive to actuation of said second switching means for setting said sign bit in accordance with the output of said amplifying means.

8. Apparatus of the type set forth in claim 7 wherein said means for generating a reference signal includes means for providing a ground potential to said amplifying means when converting numbers of a first polarity in the digital-to-analog conversion mode and for providing a reference signal to said amplifying means when converting numbers of a second polarity in the digital-to-analog conversion mode.

References Cited

UNITED STATES PATENTS

| | | | |
|---|---|---|---|
| 2,817,704 | 12/1957 | Huntley | 340—347 X |
| 2,865,564 | 12/1958 | Kaiser et al. | 340—347 X |
| 3,049,701 | 8/1962 | Amdahl et al. | 340—347 |
| 3,216,003 | 11/1965 | Funk et al. | |
| 3,234,544 | 2/1966 | Marenholtz | 340—347 |
| 3,235,862 | 2/1966 | Fiorini | 340—347 |

MAYNARD R. WILBUR, Primary Examiner
M. K. WOLENSKY, Assistant Examiner